United States Patent
Yu et al.

(10) Patent No.: US 12,255,174 B2
(45) Date of Patent: Mar. 18, 2025

(54) BONDING PASSIVE DEVICES ON ACTIVE DIES TO FORM 3D PACKAGES

(71) Applicant: Taiwan Semiconductor Manufacturing Co., Ltd., Hsinchu (TW)

(72) Inventors: Chen-Hua Yu, Hsinchu (TW); Kuo Lung Pan, Hsinchu (TW); Shu-Rong Chun, Hsinchu (TW); Chi-Hui Lai, Taichung (TW); Tin-Hao Kuo, Hsinchu (TW); Hao-Yi Tsai, Hsinchu (TW); Chung-Shi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 412 days.

(21) Appl. No.: 17/809,934

(22) Filed: Jun. 30, 2022

(65) Prior Publication Data

US 2022/0336410 A1    Oct. 20, 2022

Related U.S. Application Data

(62) Division of application No. 16/806,026, filed on Mar. 2, 2020, now Pat. No. 11,837,575.

(60) Provisional application No. 62/891,730, filed on Aug. 26, 2019.

(51) Int. Cl.
| | | |
|---|---|---|
| H01L 23/00 | (2006.01) | |
| H01L 21/56 | (2006.01) | |
| H01L 23/31 | (2006.01) | |
| H01L 23/367 | (2006.01) | |
| H01L 23/498 | (2006.01) | |
| H01L 23/64 | (2006.01) | |
| H01L 25/00 | (2006.01) | |
| H01L 25/065 | (2023.01) | |

(52) U.S. Cl.
CPC .............. *H01L 24/94* (2013.01); *H01L 21/56* (2013.01); *H01L 23/3121* (2013.01); *H01L 23/3672* (2013.01); *H01L 23/49861* (2013.01); *H01L 23/64* (2013.01); *H01L 25/0655* (2013.01); *H01L 25/50* (2013.01)

(58) Field of Classification Search
None
See application file for complete search history.

(56) References Cited

U.S. PATENT DOCUMENTS

| | | | |
|---|---|---|---|
| 4,095,867 | A | 6/1978 | Parks |
| 10,147,710 | B2 | 12/2018 | Nair et al. |
| 10,748,841 | B2 | 8/2020 | Chen et al. |
| 2005/0221633 | A1 | 10/2005 | Wildes et al. |
| 2010/0171508 | A1 | 7/2010 | Shelsky et al. |
| 2013/0168857 | A1* | 7/2013 | Gregorich ........... H01L 25/0655 257/E23.021 |

(Continued)

FOREIGN PATENT DOCUMENTS

| | | |
|---|---|---|
| JP | 2010206131 A | 9/2010 |
| KR | 20170096223 A | 8/2017 |
| KR | 20180114491 A | 10/2018 |

*Primary Examiner* — William C Trapanese
(74) *Attorney, Agent, or Firm* — Slater Matsil, LLP

(57) ABSTRACT

A package includes a package substrate, an interposer over and bonded to the package substrate, a first wafer over and bonding to the interposer, and a second wafer over and bonding to the first wafer. The first wafer has independent passive device dies therein. The second wafer has active device dies therein.

20 Claims, 28 Drawing Sheets

(56) References Cited

U.S. PATENT DOCUMENTS

| | | |
|---|---|---|
| 2015/0030297 A1 | 1/2015 | Benjamin et al. |
| 2017/0084596 A1* | 3/2017 | Scanlan |
| 2017/0103973 A1* | 4/2017 | Yu .......................... H01L 24/94 |
| 2017/0196075 A1 | 7/2017 | Barron et al. |
| 2018/0138101 A1 | 5/2018 | Yu et al. |
| 2019/0004571 A1 | 1/2019 | Sahu et al. |
| 2019/0096842 A1 | 3/2019 | Fountain, Jr. et al. |
| 2019/0131276 A1 | 5/2019 | Chen et al. |
| 2019/0189607 A1* | 6/2019 | Uzoh ................ H01L 21/76898 |
| 2019/0206837 A1 | 7/2019 | Kurita |
| 2020/0006089 A1* | 1/2020 | Yu ....................... H01L 25/0655 |
| 2020/0006252 A1 | 1/2020 | Yu et al. |
| 2020/0161252 A1 | 5/2020 | Yang et al. |
| 2020/0176427 A1 | 6/2020 | Ramachandran et al. |
| 2020/0411439 A1 | 12/2020 | Teng et al. |
| 2020/0411488 A1 | 12/2020 | Yu et al. |
| 2021/0009833 A1 | 1/2021 | Maeda et al. |

* cited by examiner

BONDING PASSIVE DEVICES ON ACTIVE DIES TO FORM 3D PACKAGES

PRIORITY CLAIM AND CROSS-REFERENCE

This application is a divisional of U.S. patent application Ser. No. 16/806,026, entitled "Bonding Passive Devices on Active Device Dies to form 3D Packages," and filed Mar. 2, 2020, which claims the benefit of the U.S. Provisional Application No. 62/891,730, entitled "Bonding Passive devices on Active device dies to form 3D packages," and filed Aug. 26, 2019, which application is hereby incorporated herein by reference.

BACKGROUND

The packages of integrated circuits are becoming increasing complex, with more device dies packaged in the same package to form a system having more functions. Independent Passive Devices (IPDs), which are discrete devices, are often used in the packages.

In conventional methods for forming packages, IPDs were bonded to a package substrate. However, this resulted in long paths between the IPDs and respective computing dies that access the IPDs. Also, memory dies were bonded to the package substrate either. This also results in long paths between the memory dies and the computing dies, and computing performance is degraded.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
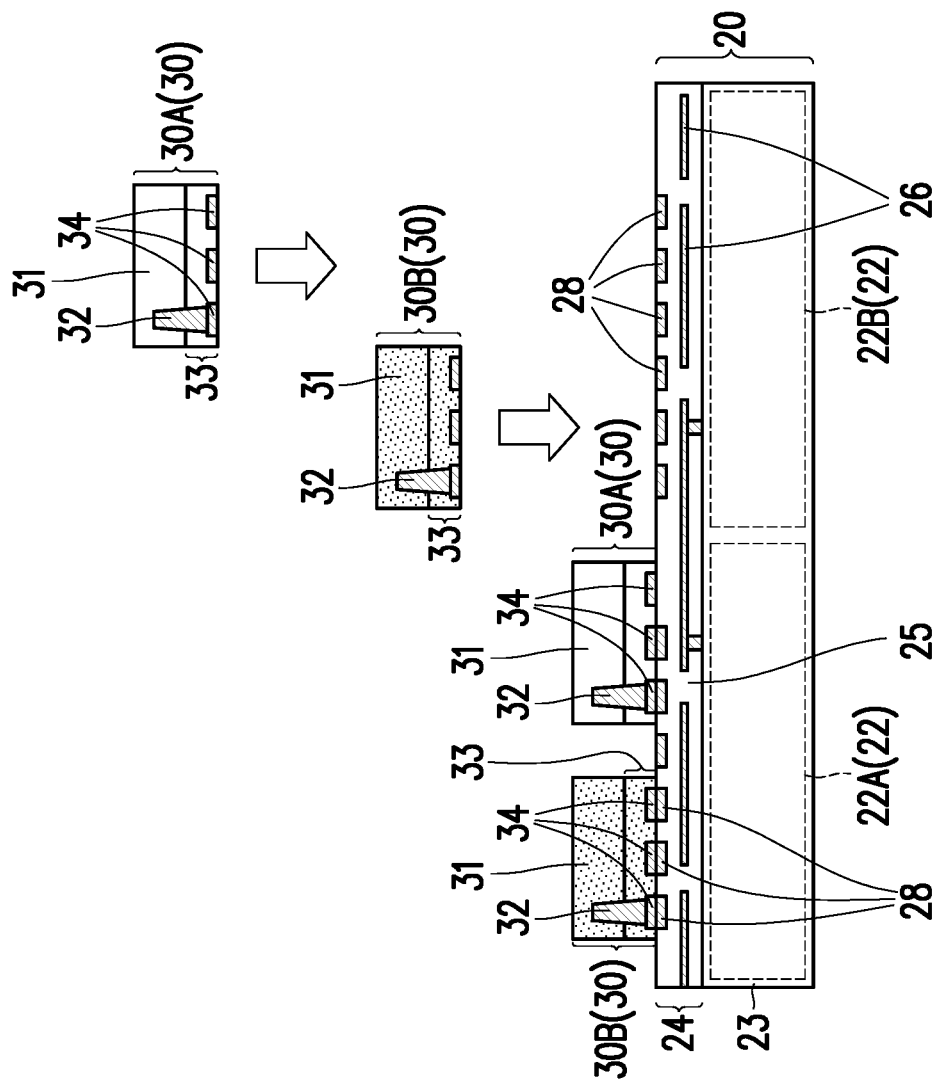
FIGS. 1-3, 4A, 4B, 5-10, 11A, and 11B illustrate the cross-sectional views, top views, and perspective views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including Independent Passive Devices (IPDs) and the method of forming the same are provided in accordance with some embodiments. The intermediate stages in the formation of the package are illustrated in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order. In accordance with some embodiments of the present disclosure, IPD dies are bonded to a device wafer to form a reconstructed package. The bonding may be performed through chip-on-wafer bonding or wafer-on-wafer bonding. Accordingly, a three-dimensional (3D) structure is formed, and the electrical paths between the IPD dies and the corresponding device dies in the device wafer are short. The resulting reconstructed package is then further bonded and/or attached with additional package components such as an interposer, a package substrate, power modules, a cold plate, etc., to form a system package.

Figure 2:
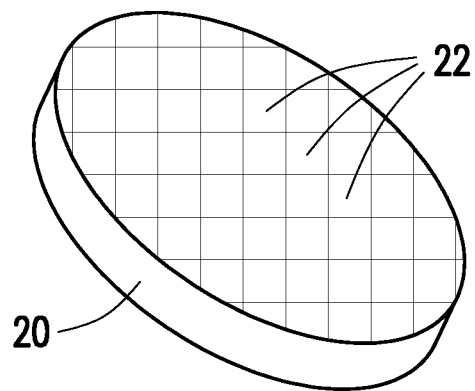

Referring to FIG. 1, device wafer 20 is provided. Device wafer 20 may have a round shape, as shown in FIG. 2, which shows a perspective view of device wafer 20. Device wafer 20 includes a plurality of device dies 22 (including 22A and 22B) therein. Device wafer 20 further includes semiconductor substrate 23, which extends continuously into all of the device dies 22. Although FIG. 1 illustrates two device dies 22, there may be a plurality of devices dies 22 as shown in FIG. 2. Device dies 22 may include integrated circuit devices (such as active devices, which include transistors, for example) at the front surface (the surface facing up) of the respective device dies. In accordance with some embodiments of the present disclosure, device dies 22 may include logic dies, which may include Central Processing Unit (CPU) dies, Graphic Processing Unit (GPU) dies, mobile application dies, Micro Control Unit (MCU) dies, BaseBand (BB) dies, Application processor (AP) dies, Field-Programmable Gate Array (FPGA) dies, Application-Specific Integrated Circuit (ASIC) dies, or the like. Device dies 22 may also include memory dies, input-output (IO) dies, or the like.

Device dies 22A and 22B may be identical, or may have different structures and/or different functions.

Device dies 22 includes interconnect structure 24 formed over the semiconductor substrate 23. Interconnect structure 24 includes dielectric layers 25, and metal lines and vias 26 formed in dielectric layers 25. Dielectric layers 25 may include an inter-layer dielectric layer, which has contact plugs (not shown) formed therein, and Inter-Metal Dielectric (IMD) layers over the inter-layer dielectric. In accordance with some embodiments of the present disclosure, some of dielectric layers 25 are formed of low-k dielectric materials having dielectric constants (k-values) lower than about 3.0. Dielectric layers 25 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with alternative embodiments of the present disclosure, some or all of dielectric layers 25 are formed of non-low-k dielectric materials such as silicon oxide, silicon carbide (SiC), silicon carbo-nitride (SiCN), silicon oxy-carbo-nitride (SiOCN), or the like.

Metal lines and vias 26 are formed in dielectric layers 25. The metal lines at a same level are collectively referred to as a metal layer hereinafter. In accordance with some embodiments of the present disclosure, interconnect structure 24 includes a plurality of metal layers that are interconnected through vias. The metal lines and vias 26 may be formed of copper or copper alloys, or other metals. The formation process may include single damascene and dual damascene processes. The metal lines and vias 26 may include diffusion barrier layers and copper regions.

In accordance with some embodiments of the present disclosure, metal pads 28 are formed at the surface of device wafer 20. Metal pads 28 may be formed of a metal such as copper or a metal alloy.

Figure 3:
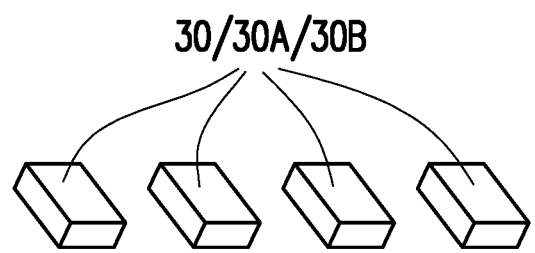
Figure 25:
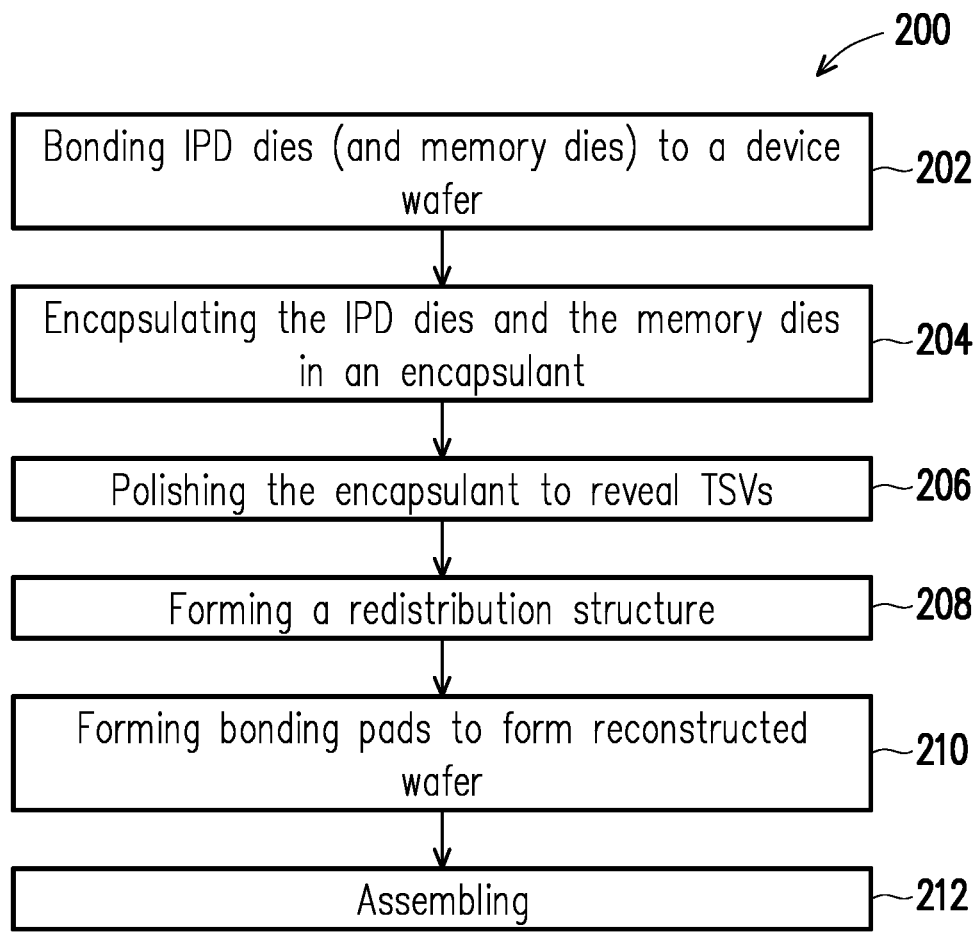
FIG. 25 illustrates a process flow for forming a package in accordance with some embodiments.

Further referring to FIG. 1, a plurality of device dies 30 (including 30A and 30B) are put into contact with and then bonded to device dies 22. The respective process is illustrated as process 202 in the process flow 200 as shown in FIG. 25. FIG. 3 illustrates the perspective view of device dies 30 in accordance with some embodiments. Device dies 30 may include semiconductor substrates 31, through-vias 32 extending into the semiconductor substrates 31, and interconnect structure 33. For example, the conductive lines in interconnect structure 33 and the devices (including active devices such as transistors and diodes and/or passive devices such as resistors, capacitors, inductors, or the like) are not shown. Furthermore, through-vias 32 have at least some portions in semiconductor substrates 31, and may or may not extend into interconnect structures 33.

Device dies 30 include device dies 30A and device dies 30B, each may be selected from an IPD die, a memory die, a logic die, or the like, in any combination. Device dies 30A and 30B may be identical to each other, or may be different from each other. For example, device dies 30A may be IPD dies, and device dies 30B may be memory dies. In accordance with some other example embodiments, device dies 30A and 30B are both IPD dies. FIG. 3 illustrates a perspective view of device dies 30.

In accordance with some embodiments, an IPD die 30 (such as 30A) includes a passive device (not shown) therein. The passive device may be a capacitor (such as a Multi-Layer Ceramic Capacitor (MLCC)), a resistor, an inductor, or the like. The passive device may be formed on the substrate of the corresponding IPD die 30, which may be a semiconductor substrate such as a silicon substrate in accordance with some embodiments. One IPD die 30A may include a single type (such as capacitor, resistor, inductor, or the like) of passive device therein, and may be free from active devices therein. One IPD die 30A may also include a single passive device. The passive device may be formed in the substrate and/or the interconnect structure of the IPD die 30A, which interconnect structure includes a plurality of dielectric layers. The passive device is connected to terminals 34, which may be metal pillars, metal pads, or the like. In accordance with some embodiments, an IPD die 30A includes two terminals 34, each connected to an end of the passive device. In accordance with some embodiments, an IPD die 30 has more than two terminals.

In accordance with some embodiments, memory dies 30 (such as 30B) include memories such as Static Random Access Memories (SRAMs), Dynamic Random Access Memories (DRAMs), Resistive Random Access Memories (RRAMs), or the like.

Figure 4A:
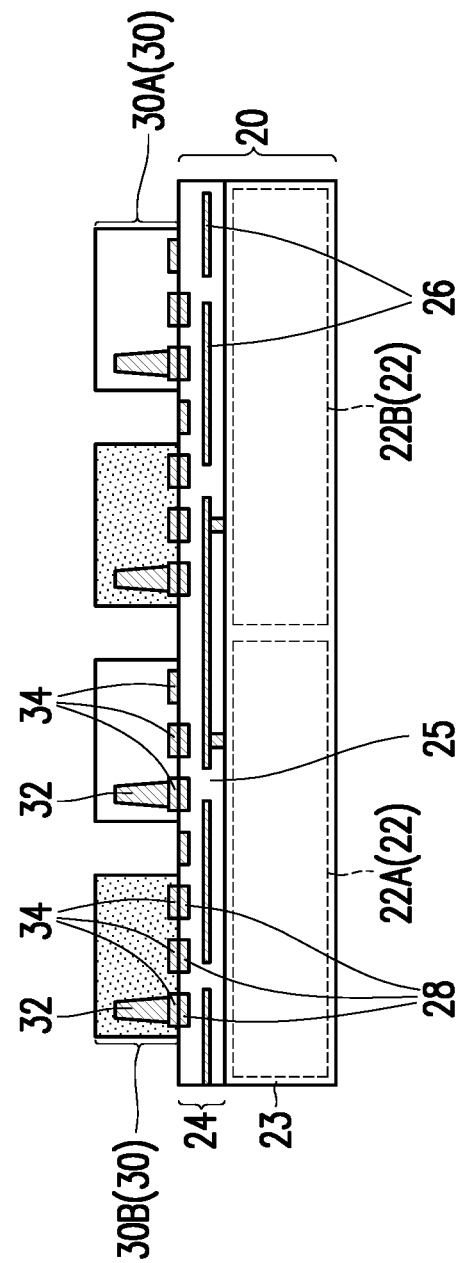
Figure 4B:
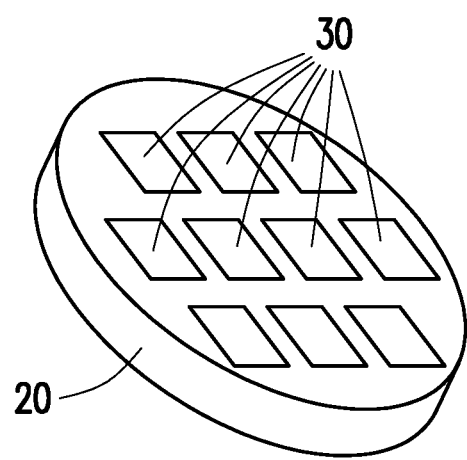

In accordance with some embodiments of the present disclosure, device dies 30 are bonded to device dies 22 through hybrid bonding, wherein the surface dielectric layers of device dies 30 are bonded to the surface dielectric layers of device dies 22 through fusion bonding. In the bonding, Si—O—Si bonds may be formed, for example, with Si atoms being in a first die, and Si—O groups being in a second die bonded to the first die. The bond pads 34 in device dies 30 are bonded to the bond pads 28 through direct metal-to-metal bonding. A cross-sectional view of the resulting bonded structure is shown in FIG. 4A. A perspective view of the resulting bonded structure is shown in FIG. 4B. In accordance with alternative embodiments, the bonding of device dies 30 to the underlying device dies 22 may including solder bonding, with solder regions (not shown) joining device dies 30 to device dies 22.

Figure 5:
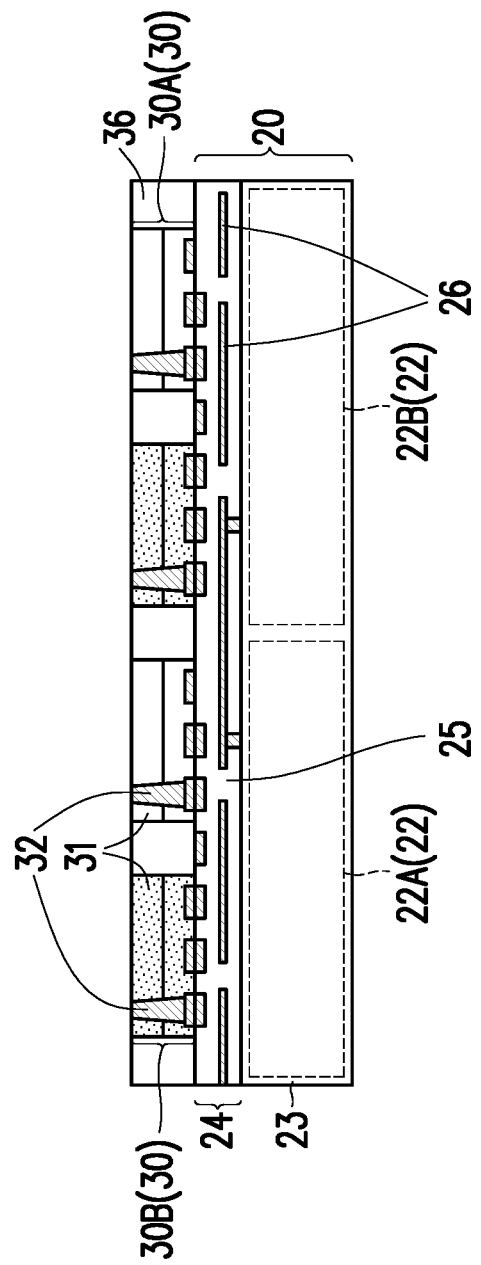

Next, if gaps exist between device dies 30 and device dies 22, the gaps are filled with an underfill. Referring to FIG. 5, encapsulant 36 is encapsulated on device dies 30. The encapsulating process includes dispensing encapsulant 36, followed by a curing process. The respective process is illustrated as process 204 in the process flow 200 as shown in FIG. 25. In accordance with some embodiments of the present disclosure, encapsulant 36 includes a molding compound, which includes a base material and fillers mixed in the base material. The base material may include a polymer, a resin, an epoxy, and/or the like. The fillers may be formed of spherical particles of silica, aluminum oxide, silicon oxide, or the like. The curing process is performed to cure and solidify encapsulant 36. In accordance with some embodiments, device dies 30 are buried in encapsulant 36. After the curing process, a planarization process such as a Chemical Mechanical Polish (CMP) process or a mechanical grinding process is performed to remove excess portions of encapsulant 36, which excess portions are over device dies 30. The resulting structure is also shown in FIG. 5. In accordance with some embodiments of the present disclosure, the substrates 31 (such as silicon substrates) of device dies 30 are exposed as a result of the planarization process. The planarization process also results in a portion of the substrate covering through-vias 32 to be removed, and through-vias 32 are exposed. The respective process is illustrated as process 206 in the process flow 200 as shown in FIG. 25.

Figure 6:
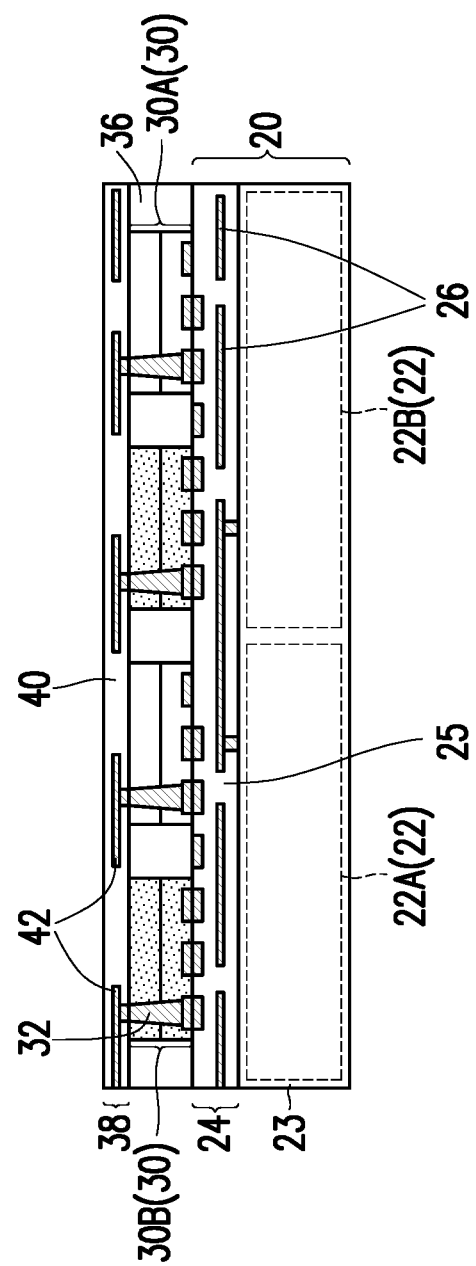

FIG. 6 illustrates the formation of dielectric layers 40 and redistribution lines (RDLs) 42, which are collectively referred to as an interconnect structure 38. The respective process is illustrated as process 208 in the process flow 200 as shown in FIG. 25. In accordance with some embodiments, dielectric layers 40 are formed of or comprise a light-sensitive polymer, which may include polybenzoxazole (PBO), polyimide, or the like. The light-sensitive polymer may be patterned through light-exposure and development. In accordance with alternative embodiments, dielectric layers 40 are formed of an inorganic material such as silicon nitride, silicon oxide, silicon oxynitride, or the like. RDLs 42 may be formed of a metal or a metal alloy such as copper, aluminum, or the alloys thereof. In accordance with some embodiments, the formation of interconnect structure 38 may include depositing a first dielectric layer, patterning the first dielectric layer to form openings in order to reveal the underlying conductive features, forming a metal seed layer, forming a patterned plating mask such as a patterned photo resist, performing a plating process, removing the patterned plating mask, and then etching the portions of the seed layer previously covered by the etching mask.

Figure 7:
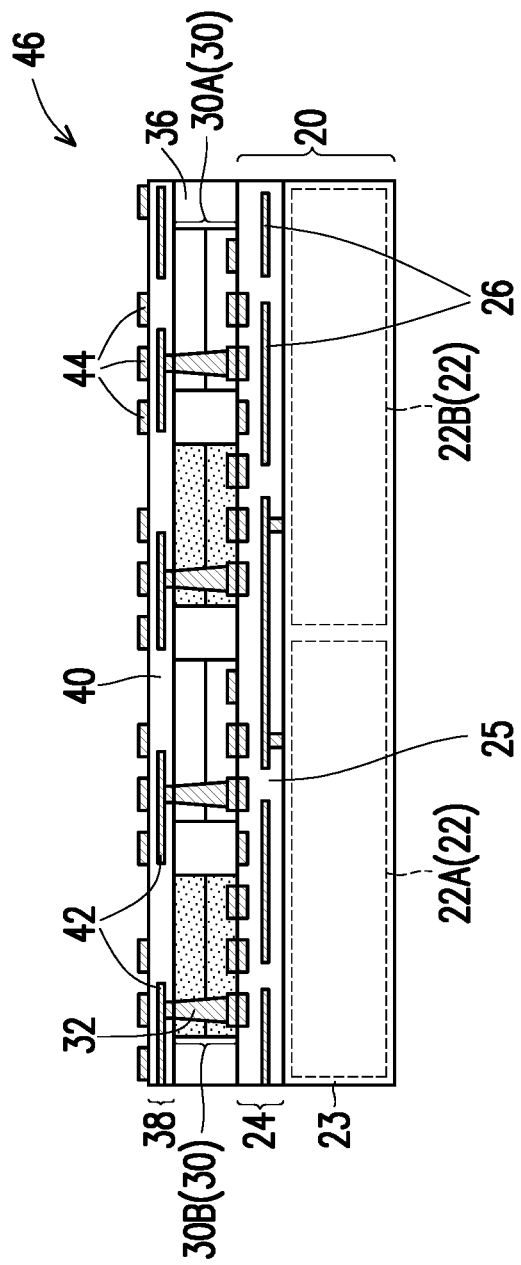

Referring to FIG. 7, bond pads 44 are formed over interconnect structure, and are electrically connected to through-vias 32 and device dies 22 through RDLs 42. The respective process is illustrated as process 210 in the process flow 200 as shown in FIG. 25. Bond pads 44 may also include Under-Bump Metallurgy (UBM) pads, which may be formed, for example using a plating process. Bond pads 44 are electrically connected to the devices in device dies 30 such as the passive devices in IPD dies 30A and the memory circuits in memory dies 30B. Throughout the description, the structure in FIG. 7 is referred to as reconstructed wafer 46.

In accordance with some embodiments of the present disclosure, through-vias 32 are used for the interconnection of bond pads 44 and device dies 22. Accordingly, through-vias 32 may replace the through-molding-vias that otherwise may be formed to penetrate through encapsulant 36. Since the through-vias 32 in IPD dies 30A and memory dies 30B are formed using the processes for forming semiconductor wafers, through-vias 32 may be formed small, and more through-vias 32 may be provided for the electrical interconnection. Some or all of through-vias 32 are solely used for the interconnection, and are not electrically connected to any devices in IPD dies 30A and/or memory dies 30B. Some (or none) of through-vias 32, when used for interconnection purpose, may also be electrically connected to the devices in IPD dies 30A and memory dies 30B through the metal lines and vias in IPD dies 30A and memory dies 30B. Also, since through-molding-vias may not be formed, the cost for forming the through-molding-vias is saved.

Figure 8:
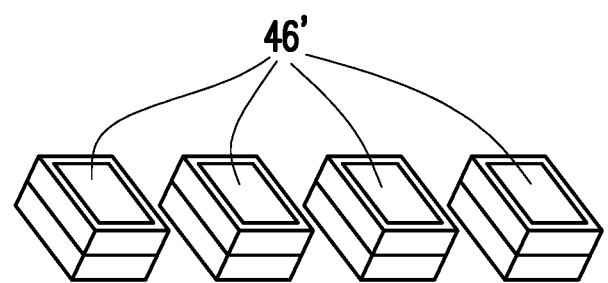
Figure 9:
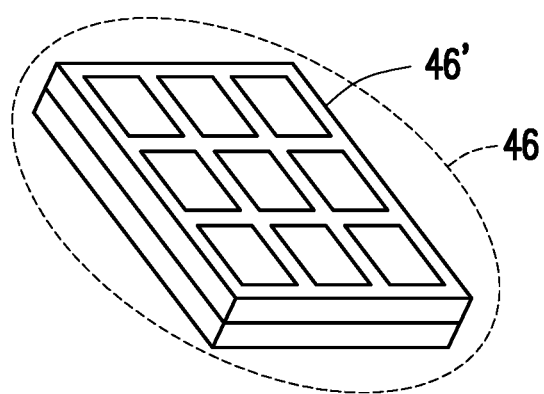
Figure 11A:
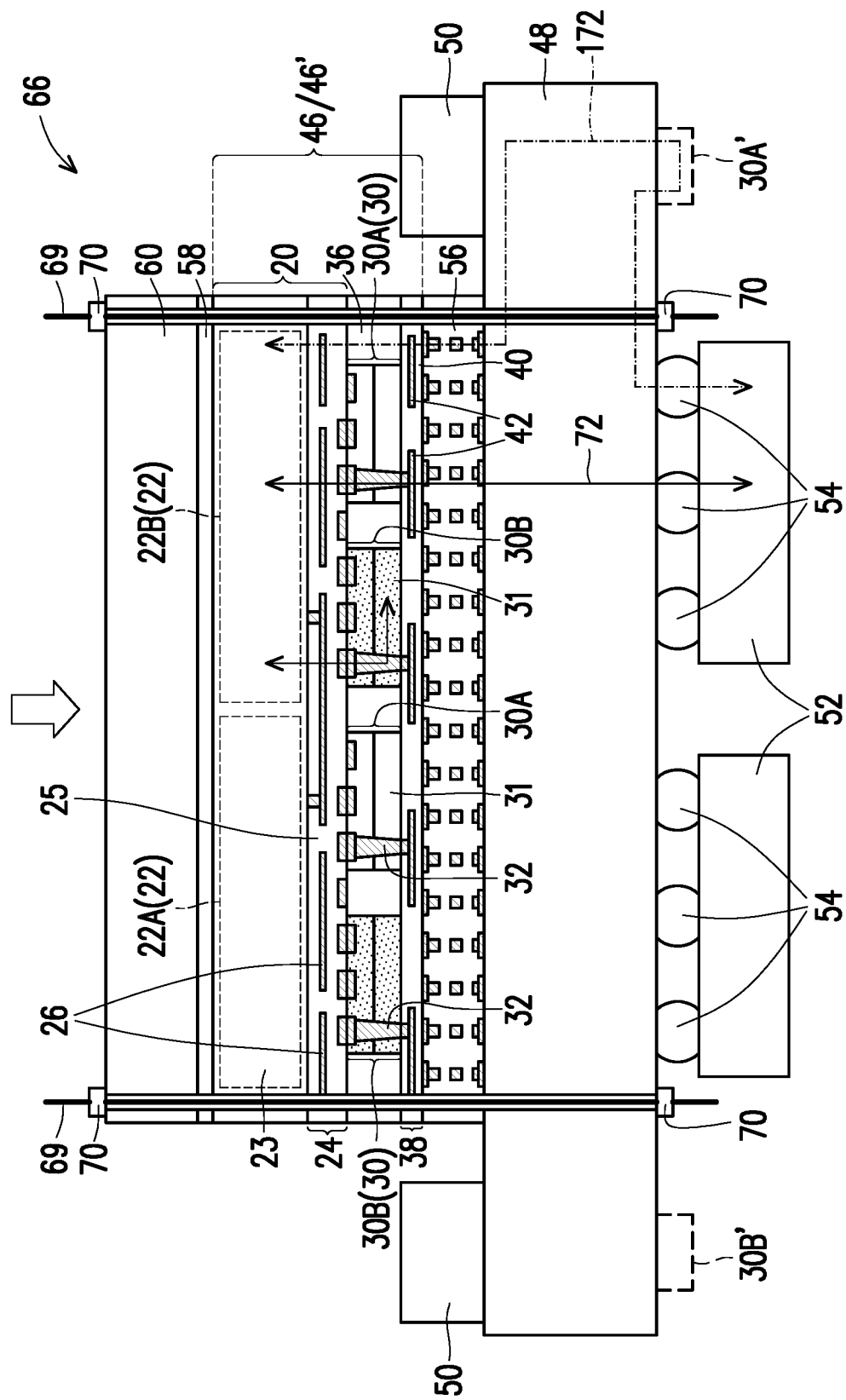
Figure 11B:
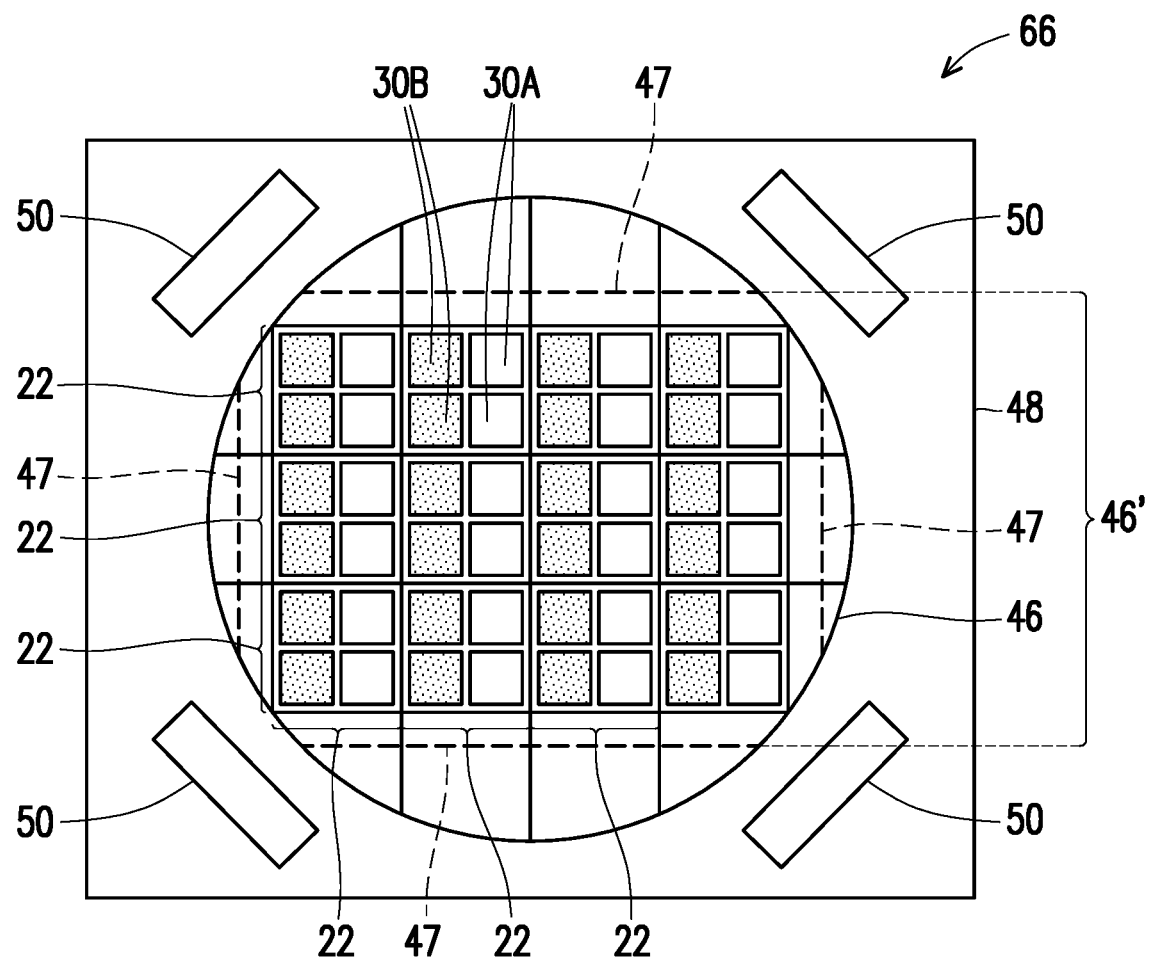

In accordance with some embodiments of the present disclosure, reconstructed wafer 46 may be used, without being sawed, in subsequent assembly process. FIG. 9 illustrates an example perspective view of the reconstructed wafer 46, which is shown using dashed lines. In accordance with alternative embodiments, reconstructed wafer 46 is sawed into smaller pieces, for example, as the packages 46' in FIG. 8. Each of reconstructed wafer 46 may be sawed into a plurality of packages 46'. A package 46' may include a plurality of device dies 30, and may include a plurality of IPD dies 30A and a plurality of memory dies 30B in accordance with some embodiments of the present disclosure. In accordance with alternative embodiments of the present disclosure, the edge portions of reconstructed wafer 46, which edge portions do not have functional devices, are cut off. For example, FIG. 11B illustrates an example, wherein the sawing is along lines 47. Accordingly, from one reconstructed wafer 46, a single package 46', which includes all of the device dies 22 and device dies 30 in reconstructed wafer 46, is obtained. The resulting package 46' is shown in FIG. 9. The package 46' as shown in FIG. 9 may have straight edges due to the sawing (refer to lines 47 in FIG. 11B), and may or may not include curved edges, depending on the positions of the saw lines 47 (FIG. 11B).

Figure 10:
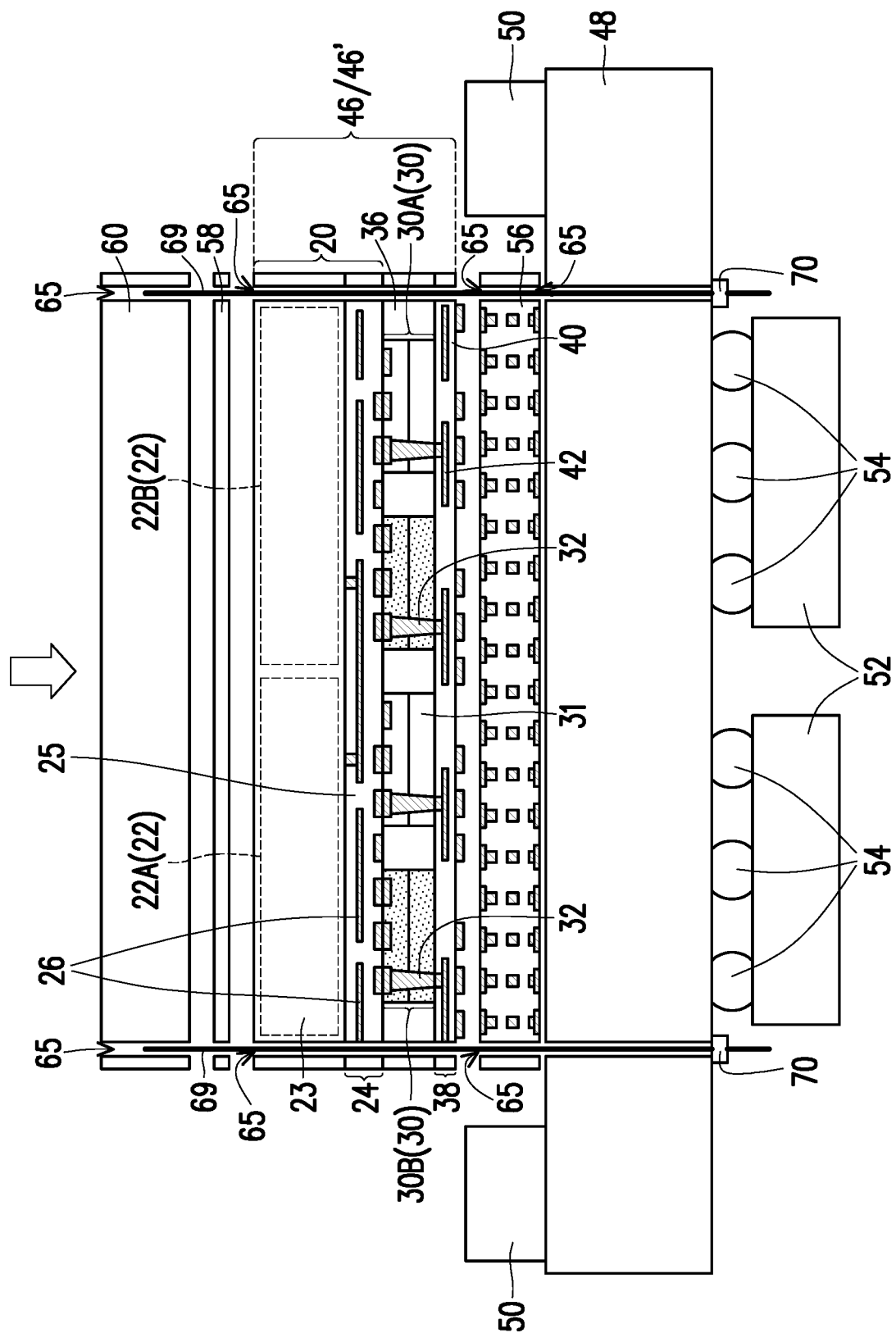

FIG. 10 illustrates an assembly process, in which reconstructed wafer 46 or package 46' is assembled into a system package. The respective process is illustrated as process 212 in the process flow 200 as shown in FIG. 25. Reconstructed wafer 46 or package 46' is referred to as package component 46/46' hereinafter. In accordance with some embodiments, the assembled components include package substrate 48, power modules 52, interposer 56, package component 46/46', connectors 50, and cold plate (heat sink) 60. The assembly process is discussed briefly in subsequent paragraphs.

In accordance with some embodiments of the present disclosure, package substrate 48 is provided. Package substrate 48 may be a substrate with a core. RDLs (not shown) are formed inside package substrate 48 and on the opposite sides of the core to interconnect the conductive features on opposite surfaces of package substrate 48. Package substrate 48 may also be a core-less substrate, with a plurality of dielectric layers and RDLs in the dielectric layers. Package substrate 48 and the subsequently bonded interposer 56 both have the functions of electrically connecting conductive features on opposite sides of the respective package substrate 48 and interposer 56.

Figure 21A:
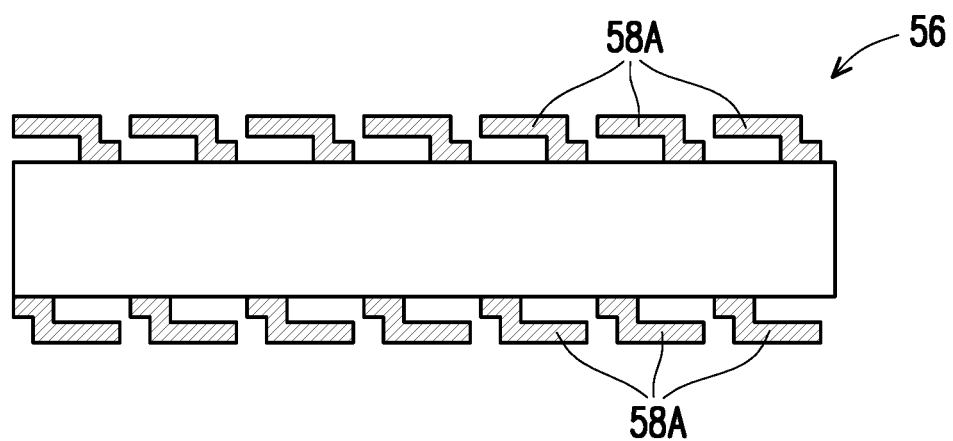
FIGS. 21A, 21B, 21C, 21D, 21E, and 21F illustrate interposers in accordance with some embodiments.
Figure 21B:
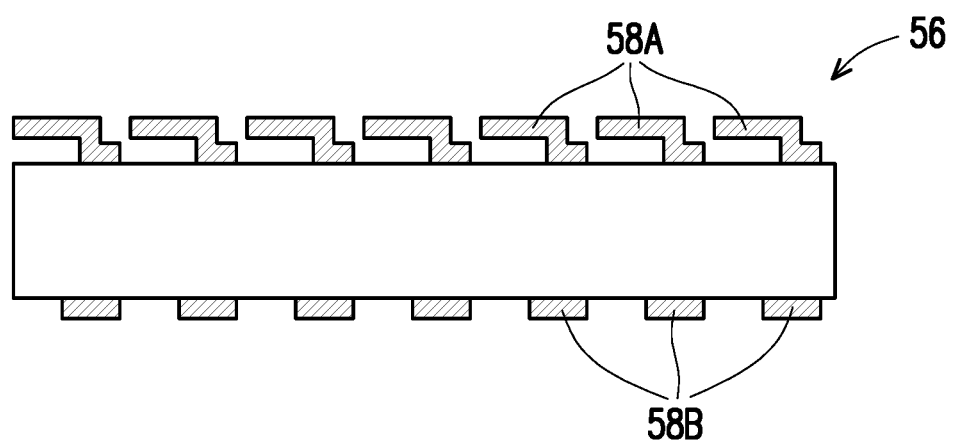
Figure 21C:
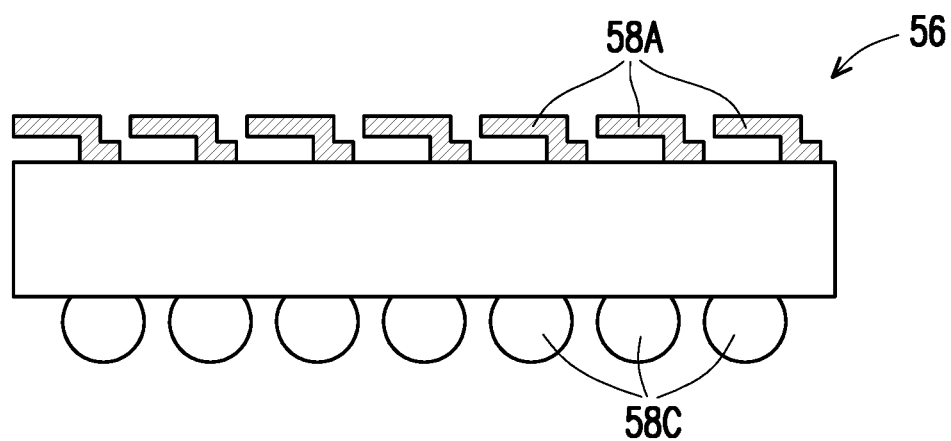
Figure 21D:
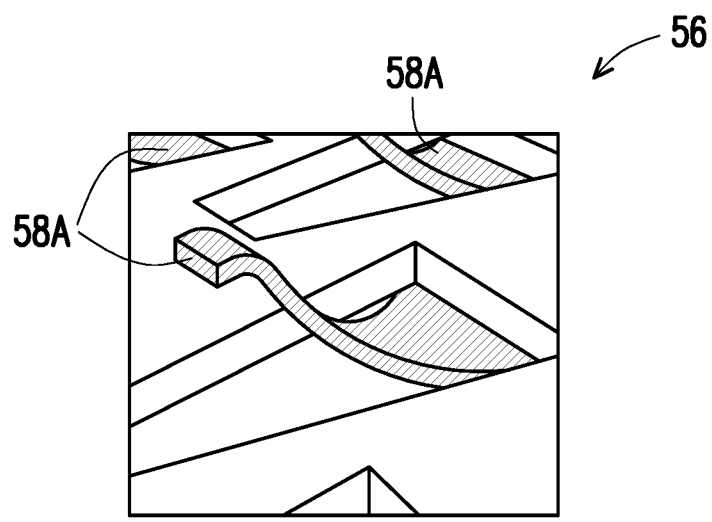

Interposer 56 is bonded to package substrate 48. Interposer 56 may have a structure selected from a plurality of candidate structures. For example, FIGS. 21A, 21B, 21C, 21D, 21E, and 21F illustrate example structures of interposer 56 in accordance with some embodiments. In each of 21A, 21B, 21C, 21D, 21E, and 21F, the conductive features on the illustrated top side are electrically connected to the conductive features on the illustrated bottom side through the internal connections (not shown). FIG. 21A illustrates interposer 56 in accordance with some embodiments, and socket pin contacts 58A are formed at both sides of interposer 56. The socket pin contacts 58A on the illustrated top side are electrically connected to the socket pin contacts 58A on the bottom side. FIG. 21B illustrates interposer 56 in accordance with some embodiments, and socket pin contacts 58A are at one side of interposer 56. On the other side, metal pads 58B are formed on the surface of interposer 56. FIG. 21C illustrates interposer 56 in accordance with some embodiments, and socket pin contacts 58A are at one side of interposer 56. On the other side, solder regions 58C are formed on the surface of interposer 56. FIG. 21D illustrates a perspective view, wherein socket pin contacts 58A (which are shown in FIGS. 21A, 21B, and 21C) are shown as inserted into the sockets of the interposer 56.

Figure 21E:
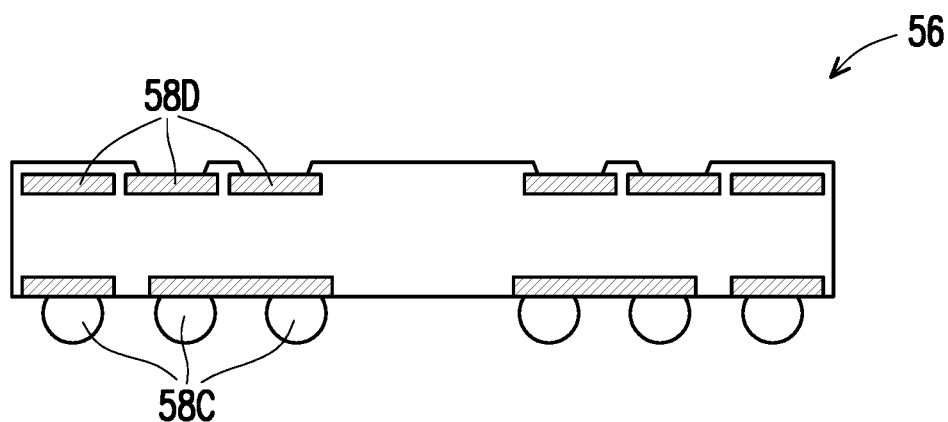
Figure 21F:
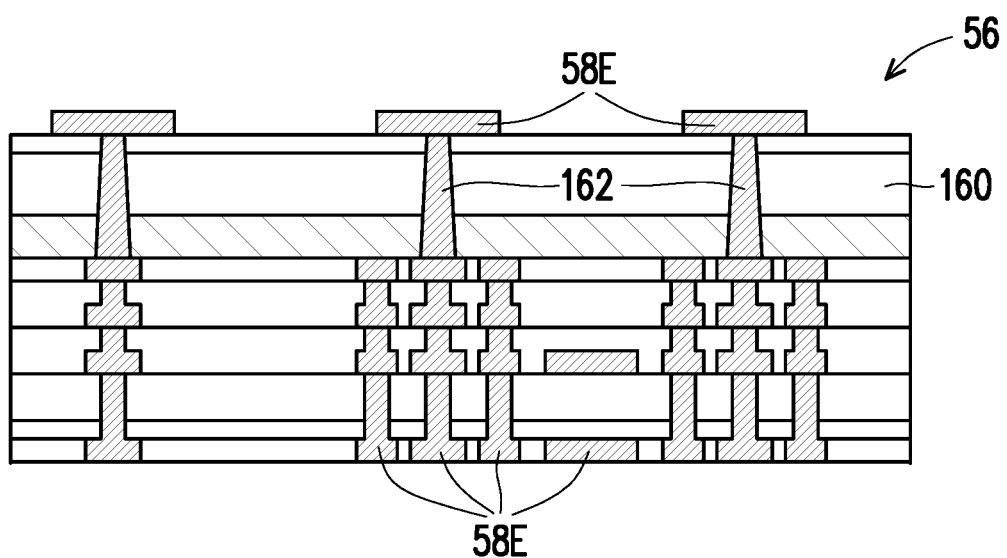

FIG. 21E illustrates interposer 56 in accordance with some embodiments, and contact pads 58D are exposed to one side of interposer 56. On the other side, solder regions 58C are formed. FIG. 21F illustrates interposer 56 including semiconductor substrate 160, and through-substrate vias 162 penetrating through semiconductor substrate 160, wherein through-substrate vias 162 electrically connect the metal pads 58E on the opposite sides of interposer 56.

Referring back to FIG. 10, In accordance with some embodiments of the present disclosure, interposer 56 is placed over, and is to be bonded to package substrate 48. The bonding may be performed through solder bonding, direct metal-to-metal bonding, pin-insertion, or the like. Package component 46/46' is to be bonded to interposer 56, for example, through solder bonding, direct metal-to-metal bonding, pin-insertion, or the like.

Figure 22:
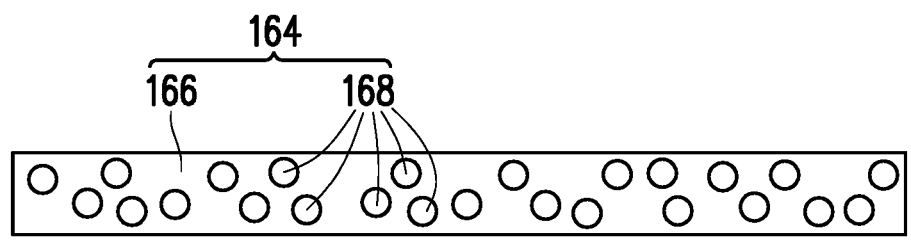
FIGS. 22-24 illustrate the cross-sectional views of intermediate stages in the using of an anisotropic conductive film as an interposer in accordance with some embodiments.

In accordance with alternative embodiments of the present disclosure, instead of using the interposer 56 as shown in FIGS. 21A through 21F, an anisotropic conductive film 164 may be used to function as an interposer. For example, FIG. 22 illustrates anisotropic conductive film 164, which includes dielectric material 166 and electrical conductive particles 168 therein. Electrical conductive particles 168 are distributed throughout dielectric material 166, and are spaced apart from each other without forming electrical paths. Dielectric material 166 may be formed of a polymer, an epoxy, an acryl, or the like. Electrical conductive particles 168 may be copper balls, aluminum balls, nickel balls, or the like, or may be metal-coated polymer balls.

Figure 23:
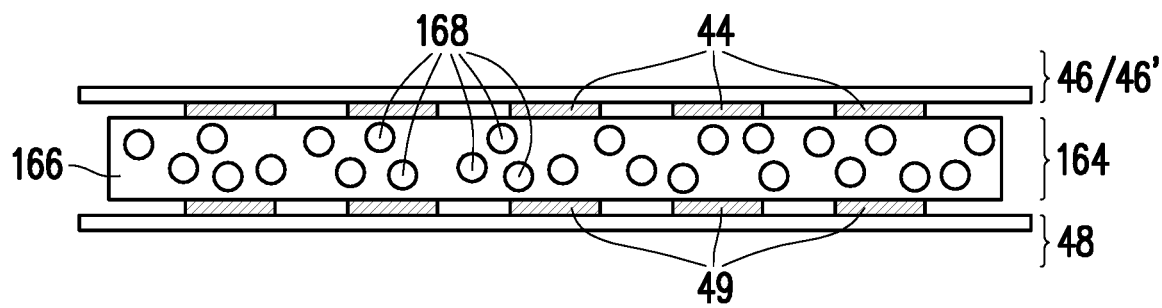
Figure 24:
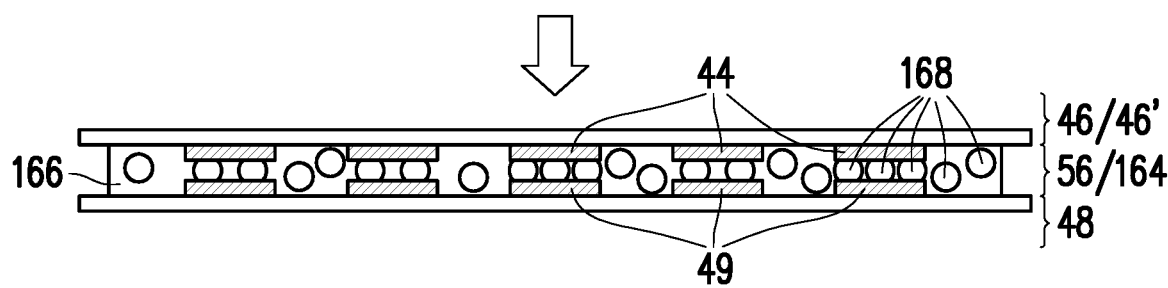

Referring to FIG. 23, package component 46/46' and package substrate 48 are pressed from opposite sides of anisotropic conductive film 164. During the pressing, package component 46/46' and package substrate 48 may or may not be heated. The protruding conductive pads 44 of package component 46/46' and the protruding conductive pads 49 of package substrate 48 are vertically aligned with a one-to-one correspondence. As a result of the pressing, the electrical conductive particles 168 between opposing conductive pads 44 and 49 are pushed together and form conductive paths, which electrically connect conductive pads 44 to the corresponding conductive pads 49. The resulting structure is shown in FIG. 24. The pressed anisotropic conductive film 164 acts as the interposer 56 as shown in FIG. 10.

Referring again back to FIG. 10, cold plate 60 is to be attached to package component 46/46' through Thermal Interface Material (TIM) 58, which is an adhesive film having good thermal conductivity. Cold plate 60 may be formed of or comprise a metallic material such as copper, aluminum, stainless steel, nickel, or the like.

Connectors 50, which are used for the signal connection between the resulting system package 66 (FIGS. 11A and 11B) and other systems, are also attached to package substrate 48. Connectors 50 may include adaptors, sockets, or the like. Connectors 50 may include a plurality of signal paths, such as a plurality of pins, pin holes, or the like, and may be used as a bus(es) for parallel or serial signal transmission between system package 66 and other systems. For example, wires (not shown) may be connected to connectors 50, and are used to connect system package 66 to other systems. Connectors 50 are electrically connected to active device dies 22 and possibly IPD dies 30A and/or memory dies 30B through package substrate 48.

As also shown in FIG. 10, power modules 52 may be bonded to package substrate 48 in accordance with some embodiments. Power modules 52 may include Pulse Width Modulation (PWM) circuits for regulating power and/or other types of power management circuits. Power modules 52 provide the regulated power to the respective overlying device dies 22 and memory dies 30B. Power modules 52 are also connected to the IPD dies 30A for power management and power storage. Power modules 52 receive power sources (such as AC power source), for example, through connection lines (which connection lines may be underlying and connected to power modules 52). The power sources and the connection lines are not illustrated.

In accordance with some embodiments of the present disclosure, power modules 52 and device dies 22 may have a one-to-one correspondence, wherein each of power modules 52 corresponds to (and may be overlapped by) one (and only one) device dies 22, and each of device dies 22 corresponds to one (and only one) of power modules 52. In accordance with alternative embodiments of the present disclosure, power modules 52 and device dies 22 have an N-to-one correspondence, with a plurality of power modules 52 correspond to, and provide power to, the same device die 22. In accordance with yet alternative embodiments of the present disclosure, power modules 52 and device dies 22 have a one-to-N correspondence, with one power module 52 correspond to, and provides power to, a plurality of device dies 22. Power modules 52 may be bonded to package substrate 48 through solder regions 54. Similarly, device dies 22 and IPD dies 30A may have a one-to-one correspondence, N-to-one, one-to-N correspondence.

In accordance with some embodiments, holes 65 are formed in package substrate 48, interposer 56, package component 46/46', TIM 58, and cold plate 60. Screws 69, which are attached to bolts 70, are inserted through holes 65, so that package substrate 48, interposer 56, package component 46/46', and cold plate 60 are secured together to form system package 66, as shown in FIG. 11A. Metal rings, braces, or the like, which are not shown, may be used to further secure system package 66.

As shown in FIG. 11A, by placing IPD dies 30A directly underlying device die 20, the electrical path 72, which is the paths connecting device dies 22 to power module 52, is shortened. For example, if an IPD (shown as IPD die 30A' using dashed lines) is bonded to package substrate 48, since IPD die 30A' is used to store power for supplying to device die 22 when needed, the corresponding electrical path 172 needs to go side-way to IPD die 30A', and then to device die 22. The electrical paths 172 are thus long. The electrical path 72 will be significantly shorter than electrical paths 172 since IPD dies 30A are directly underlying device dies 22. As a result of the short electrical paths 72, the response time for IPD die 30A to supply power is much shorter. The performance of the respective Power Deliver Network (PDN) is thus improved.

In accordance with some embodiments, as shown in FIG. 11A, IPD dies 30A may not use-up all areas underlying device dies 22, and these areas may be used by memory dies 30B. The accessing time of the memory dies 30B by device dies 22 is thus significantly shortened than attaching memory dies 30B onto package substrate 48, for example, to the position shown as 30B'.

FIG. 11B illustrates a plane view of system package 66 in accordance with some embodiments. A plurality of device dies 22, memory dies 30B, and IPD dies 30A are used in system package 66 for parallel computing in accordance with some embodiments of the present disclosure. It is appreciated that the device dies 22 in system package 66 may have same structures as each other, or may have different structures and layouts. Device dies 22 may be arranged as one array, or several arrays shifted from each other. Similarly, IPD dies 30A may be arranged as one array, or several arrays shifted from each other, and memory dies 30B may be arranged as one array, or several arrays shifted from each other.

In accordance with some embodiments of the present disclosure, as shown in FIG. 11B, package component 46/46' is at wafer level. Package component 46/46' may be a reconstructed wafer 46 that has a round top view shape, or may be cut, for example, along lines 47 to remove non-functional portions in order to reduce the size of system package 66, and to fit the shape of package substrate 48. Connectors 50 are also illustrated in FIG. 11B in accordance with some embodiments.

Figure 12A:
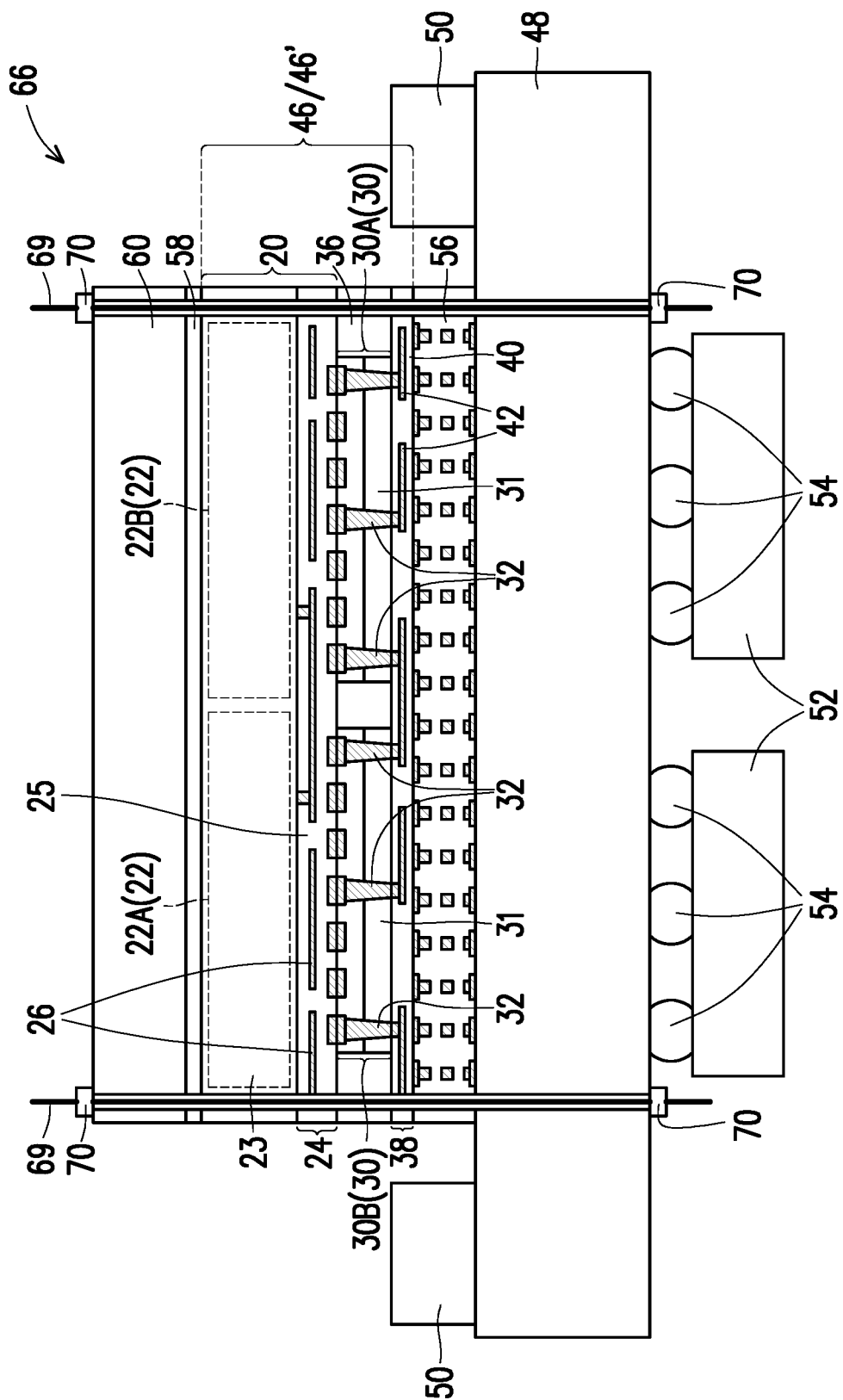
FIGS. 12A and 12B illustrate a perspective view and a plane view, respectively, of a package in accordance with some embodiments.
Figure 12B:
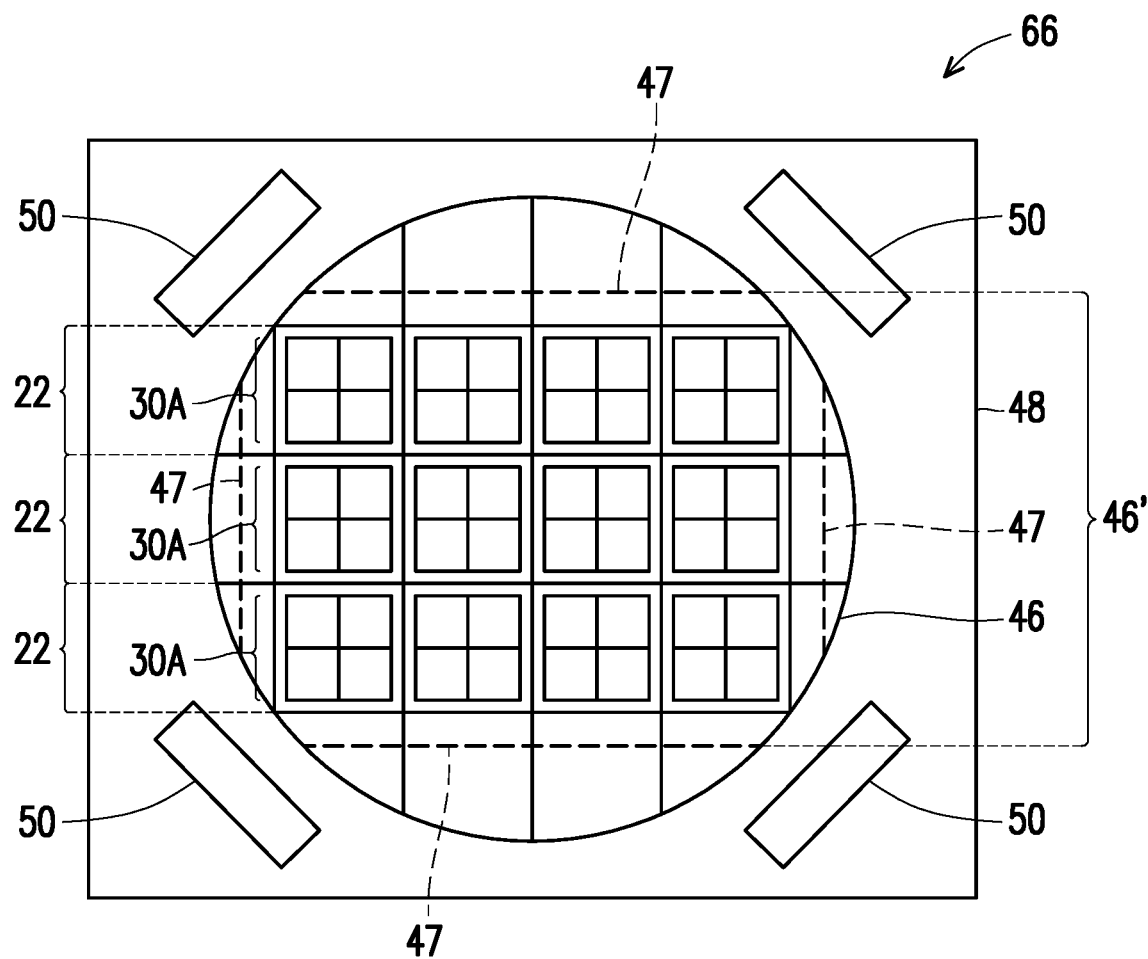

FIGS. 12A and 12B illustrate a cross-sectional view and a plane view, respectively, of system package 66 in accordance with some embodiments. For example, if IPD dies 30A are to have high capacitance values in order to store more power, the IPD dies 30A may be larger that illustrated in FIGS. 11A and 11B, and may use up the spaces under device dies 22. In accordance with these embodiments, no memory dies are placed at the same level as IPD dies 30A and overlapped by device dies 22. FIG. 12B illustrates the plane view of the structure shown in FIG. 12A. In accordance with some embodiments, each of IPD dies 30A may include a plurality of smaller IPD dies connected in parallel and sawed into one piece, as shown in FIG. 12A, which shows that four IPD dies connected in parallel as one. The formation processes for forming the system package 66 in FIGS. 12A and 12B are essentially the same as what are shown in preceding figures, except memory dies are not bonded in the process in FIG. 1.

FIGS. 13A, 13B, 14A, 14B, 15-19, 20A, and 20B illustrate cross-sectional views of intermediate stages in the formation of a system package in accordance with some embodiments of the present disclosure. These embodiments are similar to the embodiments discussed in preceding paragraphs, except that instead of performing chip-to-wafer bonding as shown in FIGS. 1 and 2, the IPD dies and the device dies are bonded through wafer-to-wafer bonding. Unless specified otherwise, the materials and the formation processes of the components in these embodiments are essentially the same as the like components, which are denoted by like reference numerals in the preceding embodiments shown in preceding figures. The details regarding the formation process and the materials of the components shown in FIGS. 13A, 13B, 14A, 14B, 15-19, 20A, and 20B may thus be found in the discussion of the preceding embodiments.

Figure 13A:
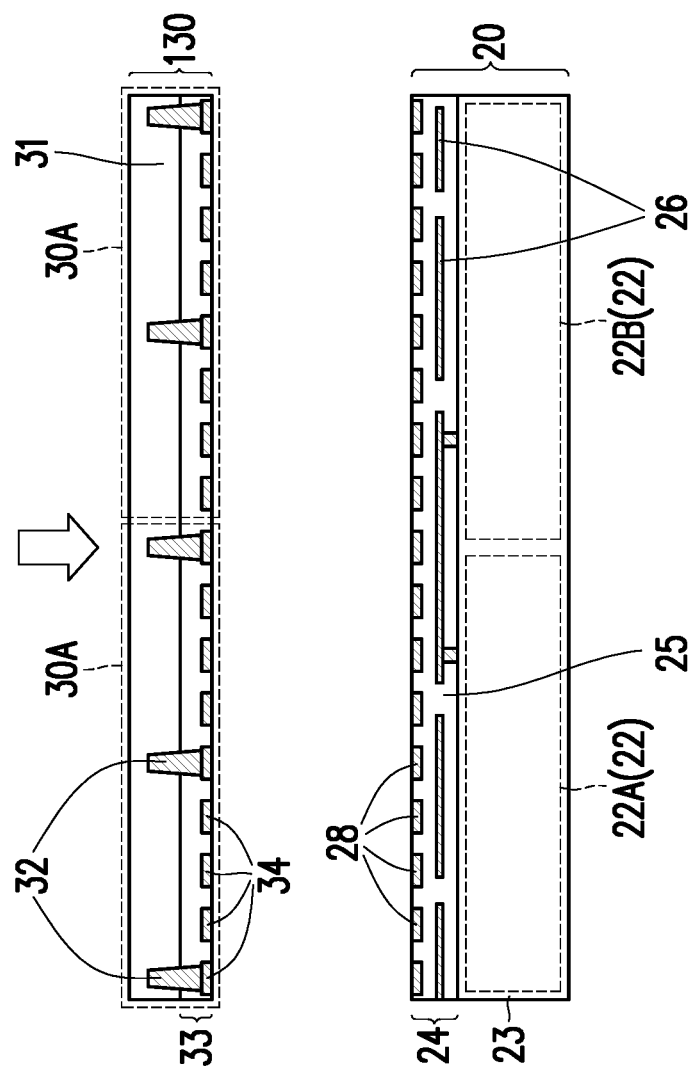
FIGS. 13A, 13B, 14A, 14B, 15-19, 20A, and 20B illustrate the cross-sectional views, top views, and perspective views of intermediate stages in the formation of a package in accordance with some embodiments.
Figure 13B:
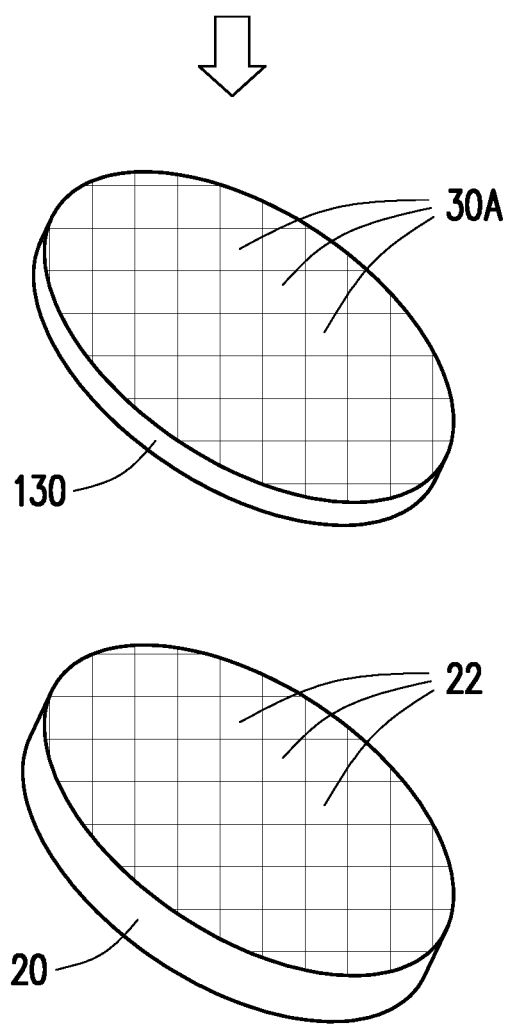

FIG. 13A illustrates device wafer 20 and IPD wafer 130, which are to be bonded together. Device wafer 20 includes device dies 22 therein, which have been described referring to FIG. 1. IPD wafer 130 includes IPD dies 30A. IPD dies 30A may be selected from the same group of candidate dies as described referring to FIG. 1, and hence are not repeated herein. The IPD dies 30A in FIG. 13A are in the un-sawed wafer 130. For example, the semiconductor substrate 31 (if any) and the dielectric layers in interconnect structure 33 may be continuous layers/regions extending continuously throughout IPD wafer 130. FIG. 13B illustrates the perspective view of device wafer 20 and IPD wafer 130.

Figure 14A:
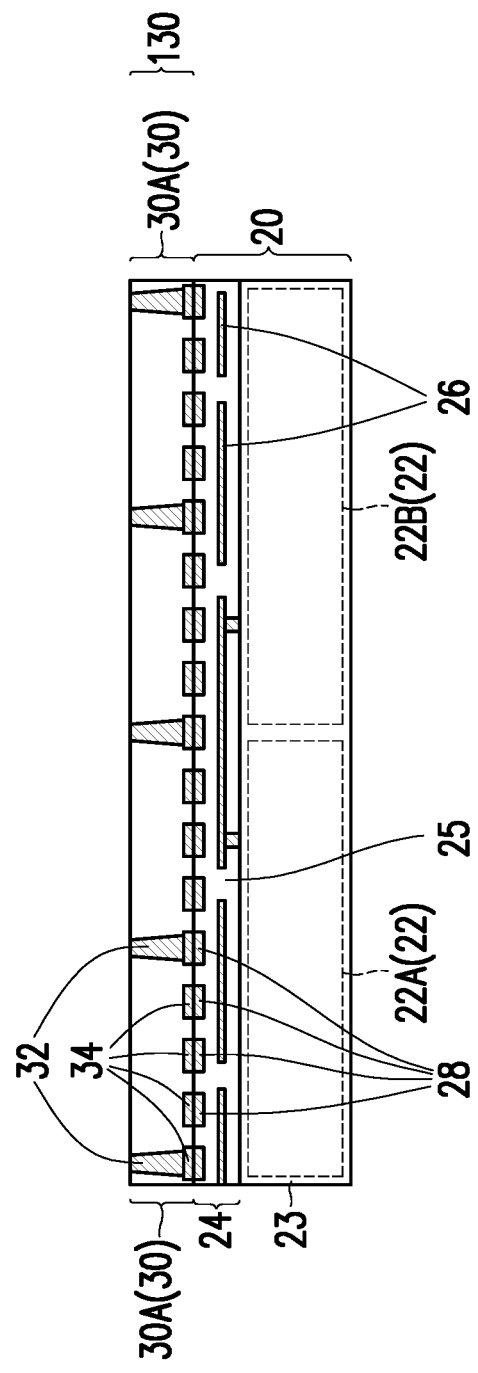
Figure 14B:
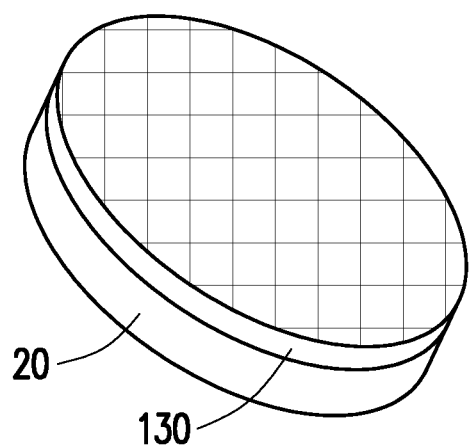
Figure 15:
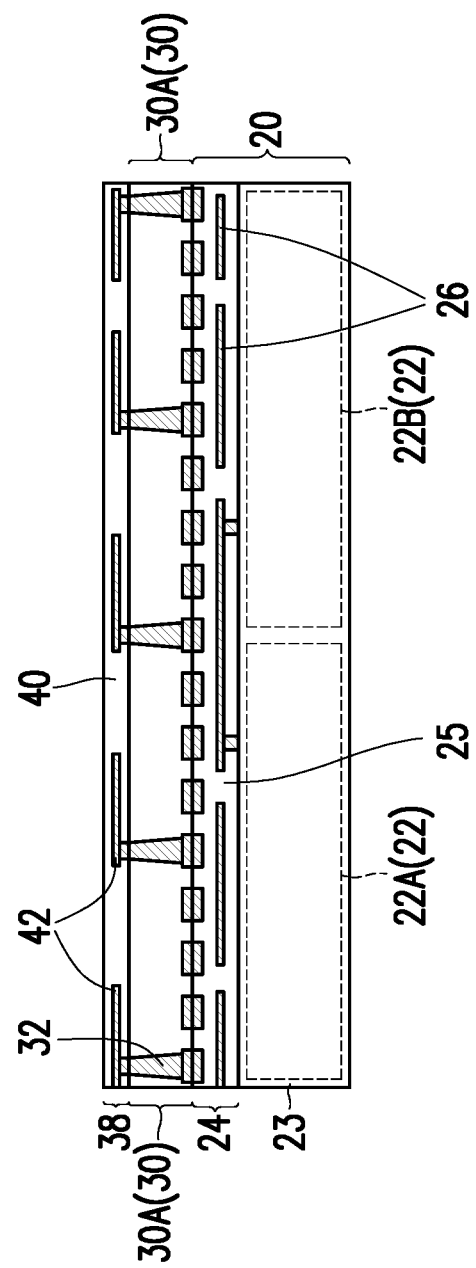
Figure 16:
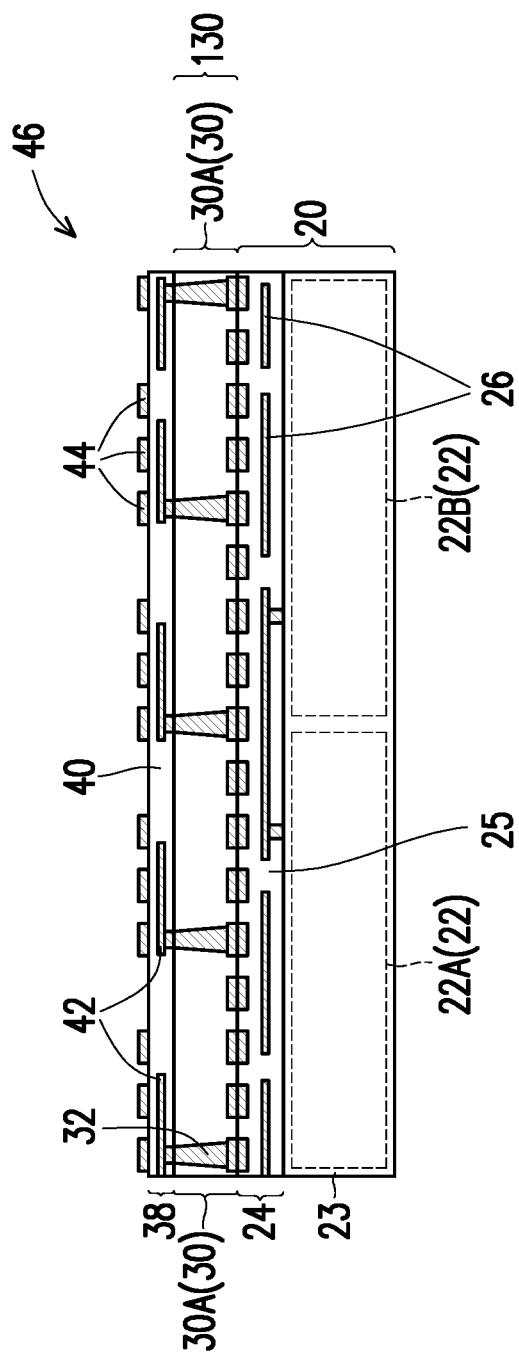
Figure 17:
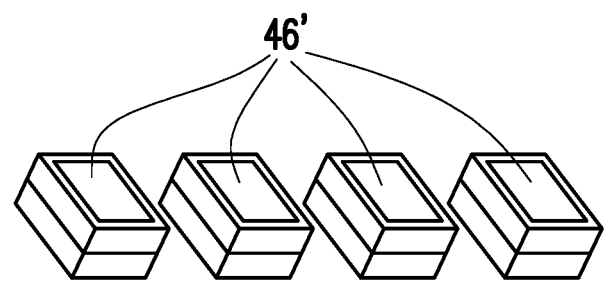

FIGS. 14A and 14B illustrate a cross-sectional view and a perspective view, respectively, of the structure with device wafer 20 bonded to IPD wafer 130. In accordance with some embodiments of the present disclosure, the bonding is through hybrid bonding. In accordance with alternative embodiments, other bonding techniques such as solder bonding, direct metal-to-metal bonding, or the like, may be used. Next, as shown in FIG. 15, a backside grinding process is performed on IPD wafer 130 to reveal through-vias 32. Redistribution structure 38 is then formed, which includes dielectric layers 40 and RDLs 42. RDLs 42 are electrically connected to the IPDs in IPD dies 30A and the active devices and passive devices in device dies 22. Next, as shown in FIG. 16, bond pads 44 are formed. Reconstructed wafer 46 is thus formed, which includes device wafer 20 bonded to IPD wafer 130 through wafer-to-wafer bonding.

Figure 18:
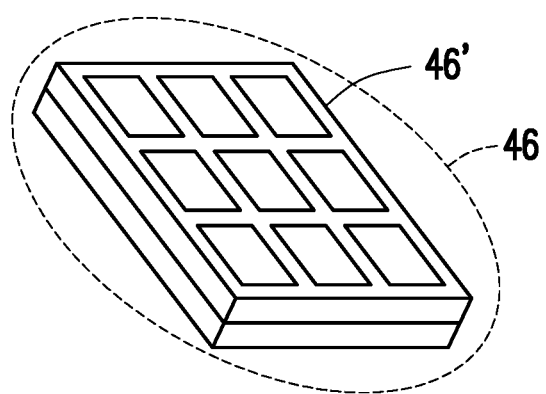

Reconstructed wafer 46 may be used without being sawed in subsequent assembly process. FIG. 18 illustrates an example perspective view of the reconstructed wafer 46, which has the round shape shown using dashed lines. In accordance with alternative embodiments, reconstructed wafer 46 is sawed into smaller pieces, for example, as the packages 46' in FIG. 17. Reconstructed wafer 46 may also be sawed into a single package by removing non-functional edge portions, similar to what is shown in FIG. 18. The sawing lines (scribe lines) 47 are similar to what are shown by dashed lines 47 in FIG. 12B as an example.

Figure 19:
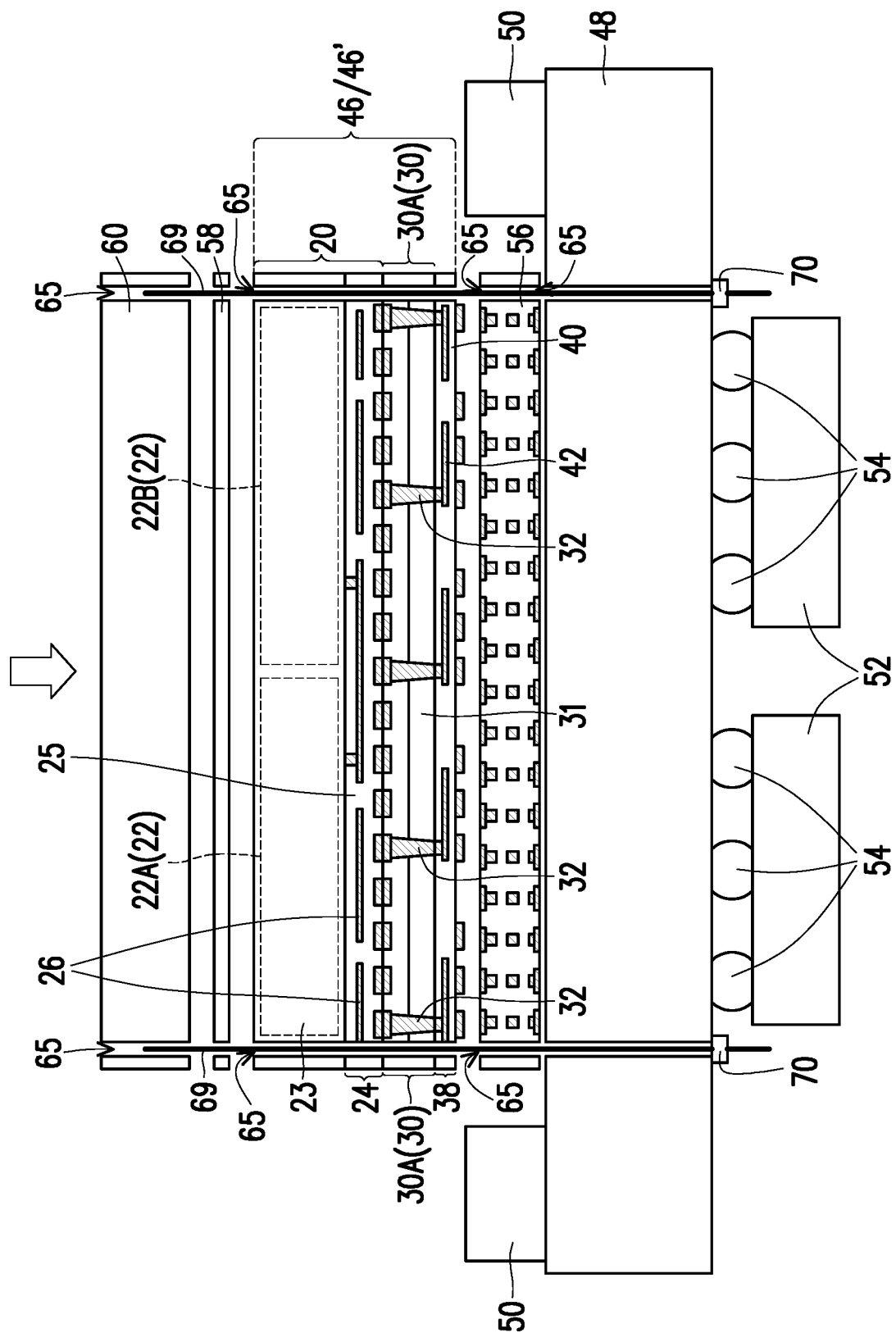
Figure 20A:
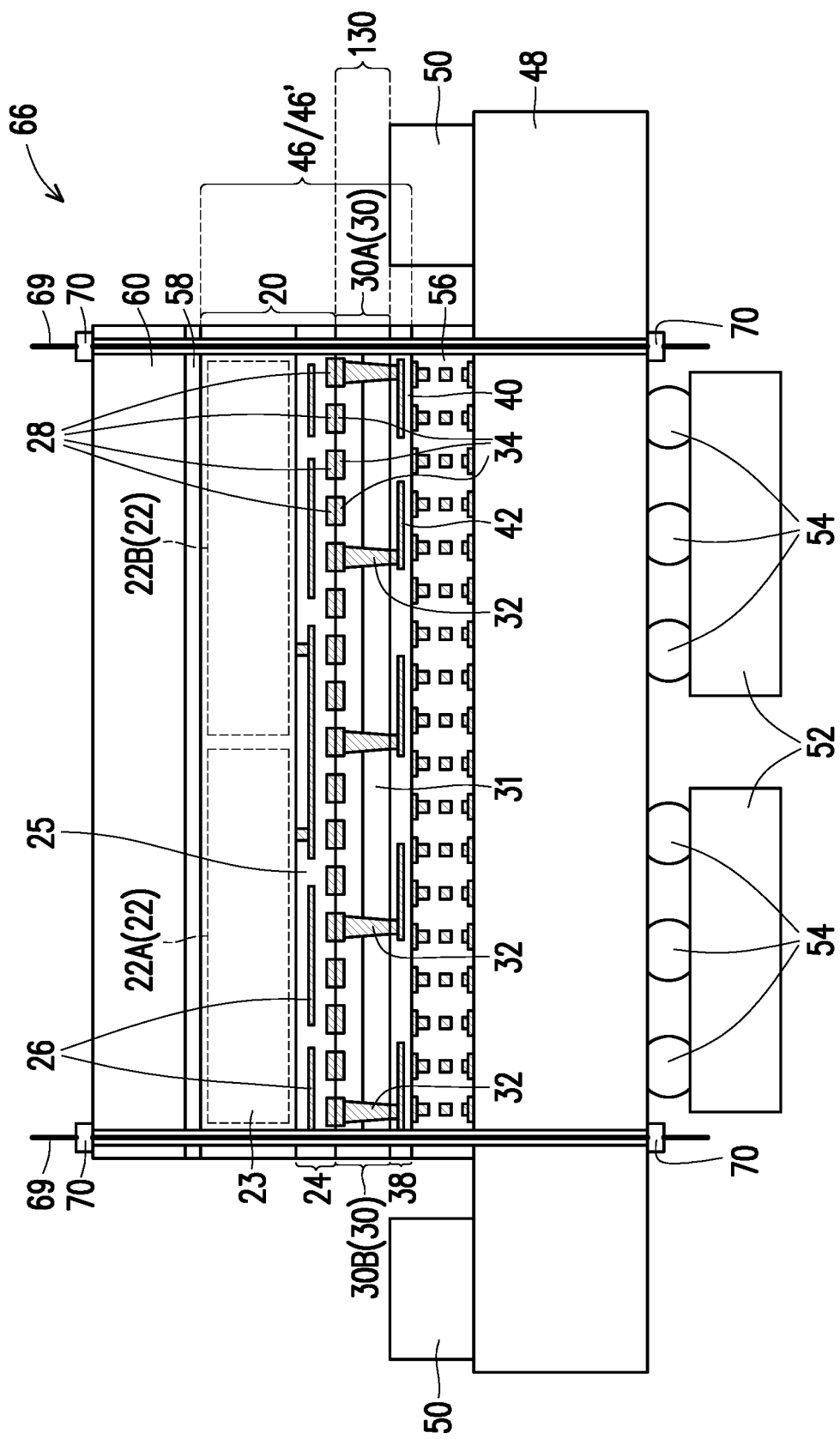
Figure 20B:
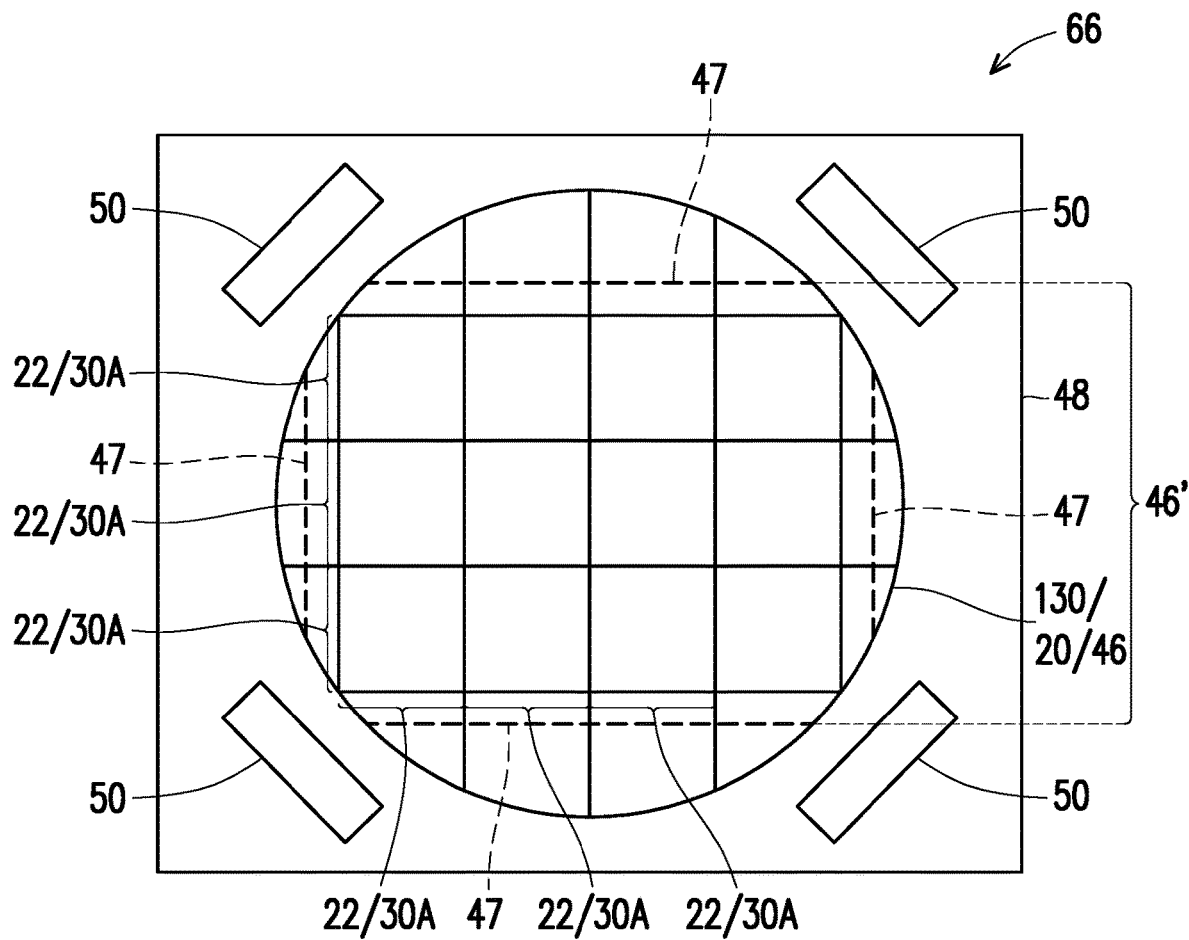

FIG. 19 illustrates the intermediate stage in the assembly process of package component 46/46' with package substrate 48, interposer 56, cold plate 60, power modules 52, and connectors 50. The details of these components are essentially the same as described referring to FIG. 10, and are not repeated herein. FIGS. 20A and 20B illustrate a cross-sectional view and a plane view, respectively, of the resulting system package 66. It is appreciated that in FIG. 20B, device dies 22 are not physically separated from each other, and IPD dies 30 are not physically separated from each other. Alternatively stated, device dies 22 are physically connected as an integrated piece, and IPD dies 30A are physically connected as an integrated piece.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By packaging IPD dies in the direct electrical paths between device dies (whose power is supplied by power modules and IPD dies) and the respective power modules, the electrical paths of the resulting power delivery network are shortened. The efficiency of the power delivery network is improved. Memory dies may also be bonded to the device dies directly to reduce the time for the device dies to access the memory dies.

In accordance with some embodiments of the present disclosure, a package comprises a package substrate; an interposer over and bonded to the package substrate; a first wafer over and bonding to the interposer, wherein the first wafer comprises independent passive device dies therein; and a second wafer over and bonding to the first wafer, wherein the second wafer comprises active device dies therein. In an embodiment, the first wafer is a reconstructed wafer comprises the independent passive device dies; and an encapsulant encapsulating the independent passive device dies therein, wherein the encapsulant separates the independent passive device dies from each other. In an embodiment, the package further comprises a plurality of memory dies encapsulated in the encapsulant, wherein each of the plurality of memory dies is overlapped by one of the active device dies. In an embodiment, the independent passive device dies are continuously and physically connected to each other to form an integrated piece. In an embodiment, the first wafer and the second wafer comprise curved edges. In an embodiment, the package further comprises a power module underlying and bonded to the package substrate. In an embodiment, the first wafer comprises a semiconductor substrate; and through-semiconductor vias penetrating through the semiconductor substrate, wherein the active device dies are electrically coupled to the power module through the through-semiconductor vias. In an embodiment, the package further comprises a connector attached to the package substrate. In an embodiment, the package further comprises a screw penetrating through the package substrate, the first wafer, and the second wafer; and a bolt attached to the screw. In an embodiment, the package further comprises a thermal interface material; and a cold plate attached to the second wafer through the thermal interface material.

In accordance with some embodiments of the present disclosure, a package comprises a plurality of independent passive device dies forming a first array, wherein the plurality of independent passive device dies comprises through-substrate vias therein; a plurality of active device dies forming a second array, wherein the plurality of active device dies overlap, and are bonded to, the plurality of independent passive device dies; a package substrate underlying the plurality of independent passive device dies; and a plurality of power modules overlapped by the plurality of independent passive device dies and the plurality of active device dies, wherein the plurality of power modules are electrically connected to the plurality of independent passive device dies and the plurality of active device dies. In an embodiment, the plurality of active device dies are continuously and physically connected to each other to form a wafer. In an embodiment, the package further comprises a molding compound molding the plurality of independent passive device dies therein. In an embodiment, the package further comprises a plurality of memory dies overlapped by, and bonded to, the plurality of active device dies.

In accordance with some embodiments of the present disclosure, a method comprises bonding an interposer with a first package, wherein the first package comprises a wafer comprising a plurality of device dies therein, wherein semiconductor substrates in the plurality of device dies are continuously connected as an integrated substrate; and a plurality of passive device dies bonded with the wafer, wherein the plurality of passive device dies are bonded between the interposer and the wafer; bonding the interposer to a package substrate; and bonding power modules to the package substrate, wherein the power modules are on an opposing side of the package substrate than the interposer. In an embodiment, the method further comprises encapsulating the plurality of passive device dies in an encapsulant; and polishing the encapsulant and the plurality of passive device dies. In an embodiment, through-substrate vias in the plurality of passive device dies are revealed by the polishing, and after the bonding the power modules, the through-substrate vias interconnect the power modules and the plurality of device dies. In an embodiment, the method further comprises bonding a plurality of memory dies with the plurality of device dies, wherein the plurality of memory dies are encapsulated in the encapsulant. In an embodiment, the method further comprises bonding the plurality of passive device dies to the wafer through a chip-to-wafer bonding process. In an embodiment, the plurality of passive device dies are in an un-sawed wafer, and the method further comprises bonding the plurality of passive device dies to the wafer through a wafer-to-wafer bonding process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
bonding an interposer with a package, wherein the package comprises:
a wafer comprising a plurality of device dies therein, wherein semiconductor substrates in the plurality of device dies are continuously connected as an integrated substrate; and
a plurality of passive device dies bonded with the wafer, wherein the plurality of passive device dies are bonded between the interposer and the wafer;
bonding the interposer to a package substrate; and
bonding power modules to the package substrate, wherein the power modules are on an opposing side of the package substrate than the interposer.

2. The method of claim 1 further comprising:
encapsulating the plurality of passive device dies in an encapsulant; and
polishing the encapsulant and the plurality of passive device dies.

3. The method of claim 2, wherein through-substrate vias in the plurality of passive device dies are revealed by the polishing, and after the bonding the power modules, the through-substrate vias electrically connect the power modules with the plurality of device dies.

4. The method of claim 2 further comprising:
bonding a plurality of memory dies with the plurality of device dies, wherein the plurality of memory dies are encapsulated in the encapsulant.

5. The method of claim 1 further comprising:
bonding the plurality of passive device dies to the wafer through a chip-to-wafer bonding process.

6. The method of claim 1, wherein the plurality of passive device dies are in an un-sawed wafer, and the method further comprises bonding the plurality of passive device dies to the wafer through a wafer-to-wafer bonding process.

7. The method of claim 6, wherein the un-sawed wafer has a round top-view shape.

8. The method of claim 6, wherein the plurality of passive device dies are in a structure that has a round top-view shape.

9. A method comprising:
bonding an interposer on a package substrate;
forming a reconstructed wafer comprising:
a device wafer comprising:
a plurality of device dies; and
an interconnect structure on the plurality of device dies;
a plurality of independent passive device dies bonded to the interconnect structure; and
an encapsulant encapsulating the plurality of independent passive device dies;
bonding the reconstructed wafer to the interposer; and
attaching a power module to the package substrate.

10. The method of claim 9, wherein the plurality of independent passive device dies are bonded to an opposite side of the interconnect structure than the plurality of device dies.

11. The method of claim 9 further comprising:
bonding a plurality of memory dies to the interconnect structure; and
encapsulating the plurality of memory dies in the encapsulant.

12. The method of claim 9, wherein the plurality of independent passive device dies are continuously and physically joined to each other to form an integrated piece, and the integrated piece is bonded to the device wafer through a wafer-to-wafer bonding.

13. The method of claim 12, wherein the integrated piece is an independent passive device wafer comprising curved edges.

14. The method of claim 13, wherein the independent passive device wafer has a round top-view shape.

15. The method of claim 9 further comprising:
attaching a plurality of power modules to the package substrate.

16. The method of claim 9, wherein the power module is attached to an opposite side of the package substrate than the plurality of independent passive device dies.

17. The method of claim 9 further comprising securing the reconstructed wafer, the interposer, and the package substrate, wherein the securing is achieved through:
a screw penetrating through the package substrate and the device wafer; and
a bolt attached to the screw.

18. A method comprising:
forming a plurality of active device dies as a first array;
bonding a plurality of independent passive device dies to the first array, wherein the plurality of independent passive device dies are arranged as a second array, and wherein the plurality of independent passive device dies comprise through-substrate vias therein;
attaching a package substrate with the plurality of active device dies; and
attaching a plurality of power modules, wherein the plurality of power modules are electrically connected to the plurality of independent passive device dies and the plurality of active device dies, and wherein both of the plurality of independent passive device dies and the package substrate are between the plurality of power modules and the plurality of active device dies.

19. The method of claim 18, wherein the plurality of active device dies are continuously and physically joined with each other to form a first wafer, and the plurality of independent passive device dies are continuously and physically joined with each other to form a second wafer.

20. The method of claim 18, wherein the plurality of independent passive device dies are discrete dies, and wherein the method further comprises molding the plurality of independent passive device dies in a molding compound.

* * * * *